(12) United States Patent
Wang et al.

(10) Patent No.: US 8,519,746 B2
(45) Date of Patent: Aug. 27, 2013

(54) VOLTAGE-TO-CURRENT CONVERTER (75) Inventors: Wei Wang, San Jose, CA (US);
Haiming Tang, Cupertino, CA (US);
Zhenchang Du, Hangzhou (CN)

(73) Assignee: Initio Corporation, San Jose, CA (US)

( * ) Notice: Subject to any disclaimer, the term of this patent is extended or adjusted under 35 U.S.C. 154(b) by 104 days.

(21) Appl. No.: 13/242,338

(22) Filed: Sep. 23, 2011

(65) Prior Publication Data
US 2013/0076403 A1 Mar. 28, 2013

(51) Int. Cl.
*H02M 11/00* (2006.01)
*H03K 3/45* (2006.01)

(52) U.S. Cl.
USPC .......................................... 327/103

(58) Field of Classification Search
USPC ......................................................... 327/103
See application file for complete search history.

(56) References Cited

U.S. PATENT DOCUMENTS 7,332,957 B2 * 2/2008 Hasegawa ..................... 327/543
7,391,169 B2 * 6/2008 Huang et al. .................. 315/291

* cited by examiner

*Primary Examiner* — John Poos
(74) *Attorney, Agent, or Firm* — Duane Morris LLP (57) ABSTRACT

A conversion circuit includes a super source follower circuit configured to lower an impedance of a first node. A digital control circuit is configured to adjust a current at the first node based on a current through the super source follower. An output transistor has a gate configured to receive a first signal. A drain of the output transistor is coupled to a first node, and a source of the output transistor is configured to output an output current based on a voltage of the first signal.

34 Claims, 6 Drawing Sheets

VOLTAGE-TO-CURRENT CONVERTER

FIELD OF DISCLOSURE

The disclosed circuits and methods relate to integrated circuits. More specifically, the disclosed circuits and methods relate to voltage-to-current converters for integrated circuits.

BACKGROUND

In serial data communication system, jitter plays a key role in data transfer and system timing. Noise from power supply will degenerate the jitter performance of data communication system, so low noise and high PSR V-I Convert for VCO, which generates clock for system, is required.

Figure 1:
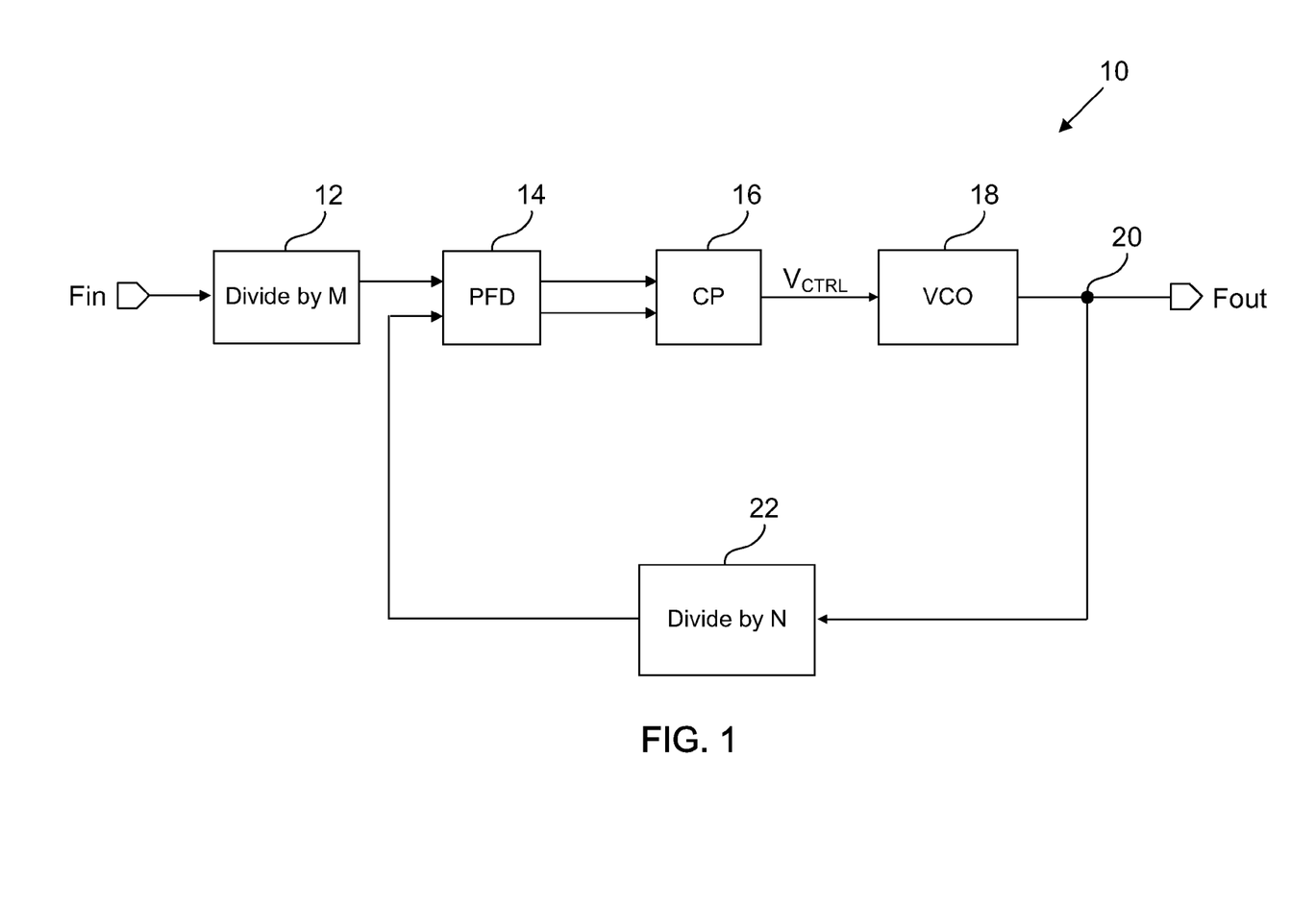
FIG. 1 is a block diagram of one example of a phase-locked loop in which an improved voltage-to-current converter may be implemented.

Conventional V-I Converter uses unit gain buffer, which is shown as FIG. 1, while this structure has several disadvantages. First, unit gain buffer brings addition poles to PLL Loop, which complicates the design of PLL Loop. Second, it's hard to realize high Power Supply Rejection (PSR), and also device noise from unit gain buffer often degenerate the phase noise of VCO, making the jitter performance of PLL worse.

SUMMARY

In some embodiments, a conversion circuit includes a super source follower circuit configured to lower an impedance of a first node. A digital control circuit is configured to adjust a current at the first node based on a current through the super source follower. An output transistor has a gate configured to receive a first signal. A drain of the output transistor is coupled to a first node, and a source of the output transistor is configured to output an output current based on a voltage of the first signal.

In some embodiments, a method includes receiving a current at a first node, receiving a first portion of the current through a super source follower circuit coupled to the first node, receiving a voltage level at a gate of a transistor coupled to the first node, and outputting a second portion of the first current from the transistor based on the voltage level.

In some embodiments, a conversion circuit includes a first plurality of transistors and a first plurality of switches. Each of the first plurality of transistors has a respective source coupled to a first voltage supply and a respective drain coupled to a first node. Each of the plurality of switches is respectively coupled to a gate of one of the first plurality of transistors. A super source follower circuit is configured to lower an impedance of the first node, and a digital control circuit configured to output digital control signals to the first plurality of switches for adjusting a current at the first node by selectively coupling the gates of the first plurality of transistors to a bias voltage. The digital control signals are based on a current through the super source follower. An output transistor is coupled to the first node and configured to output an output current based on a voltage received at a gate of the output transistor.

DETAILED DESCRIPTION

The improved voltage-to-current ("V-I") conversion circuit and method described herein have improved power supply rejection, i.e., reduced noise from a power supply, compared to conventional V-I conversion circuits. The V-I circuit includes a digital control circuit that adjusts a current through a first node based on a current through a super source follower. The super source follower advantageously lowers the impedance at the first node, which is coupled to a transistor that provides an output current in response to a voltage received at the gate of the transistor.

FIG. 1 is a block diagram of one example of a phase-locked loop ("PLL") 10 that may be configured with an improved V-I converter. PLL 10 is configured to receive an input reference signal, Fin, and output a signal, Fout, having a phase that is related to the phase of the input reference signal. As shown in FIG. 1, PLL 10 includes a divide by M block 12 configured to receive the input reference signal and coupled to a phase frequency detector ("PFD") 14. A charge pump ("CP") 16 is coupled to the output of PFD 14 and provides a control signal to a voltage controlled oscillator ("VCO") 18. VCO 18 outputs output signal, Fout, to node 20, which is fed back to PFD 14 through a divide by N block 22.

Figure 2:
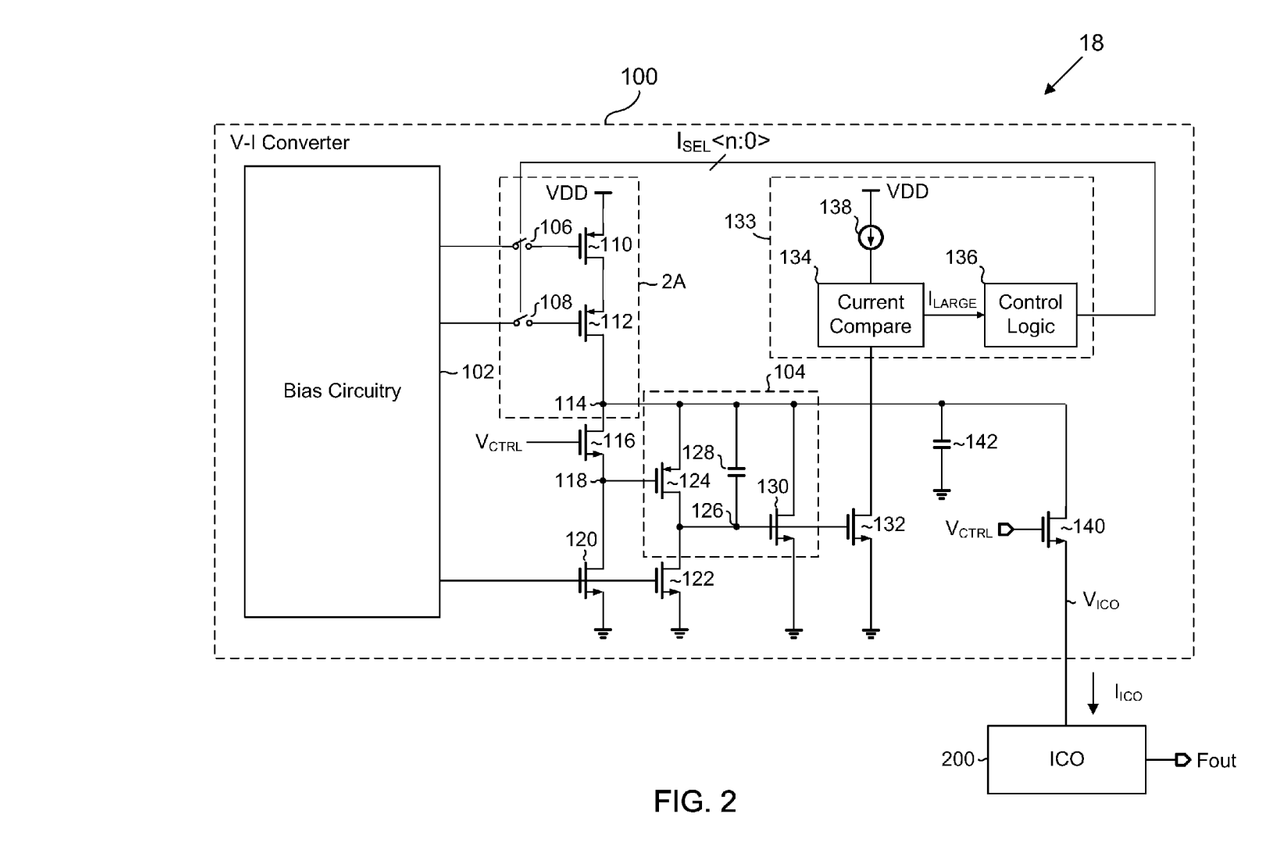
FIG. 2 is a circuit diagram of one example of an improved voltage-to-current converter.

As shown in FIG. 2, VCO 18 may include a V-I converter 100 configured to convert the voltage received from CP 16, $V_{CTRL}$, to an output current, $I_{ICO}$, which is provided to a current controlled oscillator ("ICO") 200. V-I converter 100 includes bias circuitry 102 and a super source follower ("SSF") 104. Bias circuitry is coupled to first and second switches 106 and 108, which are respectively coupled to the gates of PMOS transistors 110 and 112. Although single switches 106, 108 and transistors 110, 112 are illustrated in FIG. 2, one skilled in the art will understand that a plurality of switches 106, 108 and transistors 110, 112 may be implemented to provide multi-bit sensitivity.

Figure 2A:
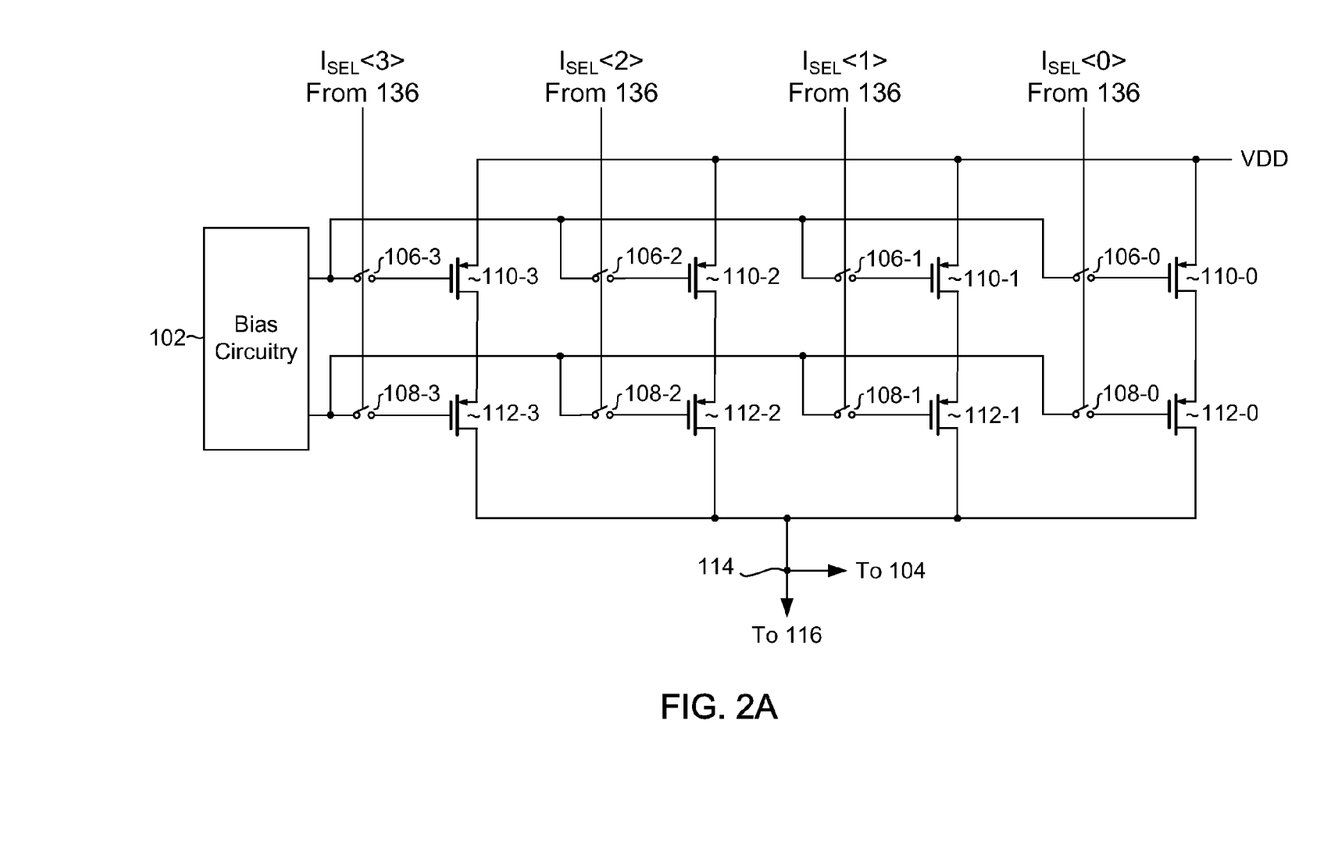
FIG. 2A is a detailed view of one example of the switches and transistors in box 2A shown in FIG. 2.

For example, transistor 110 may include a plurality of transistors 110 coupled together in parallel with each of the transistors having a respective switch 106 coupled to its gate as illustrated in FIG. 2A, which is a detailed figure illustrating box 2A in FIG. 2 when control logic 136 provides a four-bit $I_{SEL}$ signal, i.e., $I_{SEL}<3:0>$. As shown in FIG. 2A, four switches 106-0, 106-1, 106-2, and 106-3 (collectively referred to as "switches 106") are coupled between bias circuitry 102 and the gate of a respective transistor 110-0, 110-1, 110-2, and 110-3 (collectively referred to as "transistors 110"). Each of switches 108-0, 108-1, 108-2, and 108-3 (collectively referred to as "switches 108") are also coupled between bias circuitry 102 and the gate of a respective transistor 112-0, 112-1, 112-2, and 112-3 (collectively referred to as "transistors 112").

The opening and closing of each of switches 106-3 and 108-3 is controlled by control signal $I_{SEL}<3>$, which may be the most significant bit a four-bit control signal generated by control logic 136. In a similar matter, the opening and closing of switches 106-2 and 180-2 may be controlled by control signal $I_{SEL}<2>$, the opening and closing of switches 106-1 and 108-1 may be controlled by signal $I_{SEL}<1>$, and the opening and closing of switches 106-0 and 108-0 may be controlled by control signal $I_{SEL}<0>$. Switches 106 selectively couple bias circuitry 102 to the gates of transistors 110, and switches 108 selectively coupled bias circuitry 102 to the gates of transistors 112. Transistors 110 have their respective sources coupled to a first voltage supply, which may be set at operating voltage VDD, and their respective drains coupled to the respective sources of transistors 112. Transistors 112 have their sources coupled together and to node 114.

Referring again to FIG. 2, node 114 is coupled to SSF 104 and to the drain of NMOS transistor 116. The gate of NMOS 116 is configured to receive $V_{CTRL}$ from CP 16, and the source of transistor 116 is coupled to node 118. Node 118 is coupled to SSF 104 and to the drain of NMOS transistor 120, which has its gate coupled to bias circuitry 102 and its source coupled to a second voltage supply that may be set at ground. NMOS transistor 122 has its gate coupled to bias circuitry 102, its source coupled to the second voltage supply, and its drain coupled to SSF 104.

SSF 104 includes an PMOS transistor 124 having a gate coupled to node 118, a source coupled to node 114, and a drain coupled to node 126, which is coupled to the drain of transistor 122. A capacitor 128 is disposed between nodes 114 and 126 such that capacitor 128 is in parallel with transistor 124. SSF 104 also includes NMOS transistor 130, which has its source coupled to ground, its gate coupled to node 126, and its drain coupled to node 114.

Transistor 132 is coupled to SSF 104 at its gate. More specifically, NMOS transistor 132, which may be referred to a sense transistor, has its gate coupled to node 126, its source coupled to the second voltage supply, and its drain coupled to a current comparison block 134 of digital control circuit 133. Digital control circuit 133 is configured to digitally control the opening and closing of switches 106 and 108 based on a current through SSF 104 as sensed by transistor 132.

Digital control circuit 133 includes a current comparison circuit 134 and a control logic block 136. Current comparison block 134 compares the current flowing through transistor 132, which mirrors a portion of the current through SSF 104, to a reference current received from current source 138. In some embodiments, transistor 132 is sized such that is a fractional size of transistor 130 of SSF 104. For example, transistor 132 may be sized such that it is $1/8^{th}$ the size of transistor 130. One skilled in the art will understand that transistor 132 may be other fractional sizes of transistor 130 including, but not limited to, $1/2$, $1/3$, $1/4$, $1/5$, or $1/6$, to name only a few potential possibilities.

Control logic 136 is configured to output a digital control signal, which include a plurality of bits, in response to receiving a current-level signal, $I_{LARGE}$, received from current compare circuit 134. The digital control signal is output to switches 106 and 108, which selectively coupled the gates of transistors 110 and 112 to bias circuit 102.

Node 114 is also coupled to the drain of output transistor 140 and to capacitor 142, which is also coupled to the second voltage supply. The gate of transistor 140 is configured to receive signal $V_{CTRL}$ from CP 16 (FIG. 1), and the source of transistor 140 is coupled to ICO 200. Transistor 140 turns into an 'on' or current-conducting state when the voltage level of $V_{CTRL}$ is greater than the threshold voltage of transistor 140, $V_{T140}$, and turns into an 'off' or non-current-conducting state when the voltage level of $V_{CTRL}$ is less than $V_{T140}$. When transistor 140 is on, a portion of the current from node 114 is output to ICO 200 through transistor 140.

Figure 3:
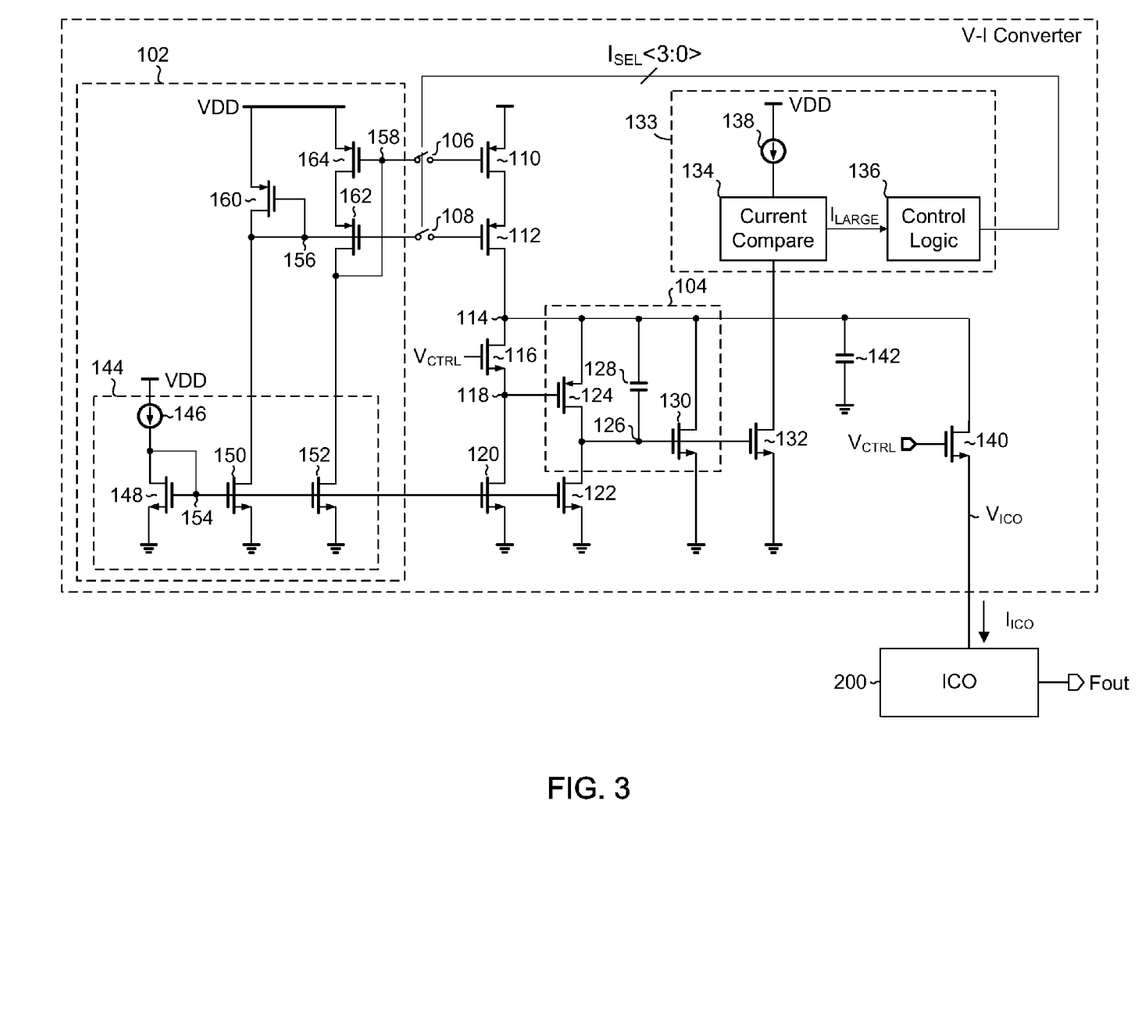
FIG. 3 is a more detailed circuit diagram one example of an improved voltage-to-current converter.

FIG. 3 illustrates V-I converter 100 configured with one example bias circuitry 102. Bias circuitry 102 may include a current mirror 144 formed by current source 146 and transistors 148, 150, and 152. NMOS transistor 148 has its drain and gate coupled together at node 154 and its source is coupled to the second voltage supply. NMOS transistor 150 has its gate coupled to node 154, its source coupled to the second voltage supply, and its drain coupled to node 156. Node 154 is also coupled to the gate of transistor 152, which has its source coupled to the second voltage supply and its drain coupled to node 158.

Node 156 is coupled to the gate and drain of PMOS transistor 160, to the gate of PMOS transistor 162, and to switch 108. The source of transistor 160 is coupled to the first voltage supply line. Transistor 162 has its drain coupled to node 158 and its source coupled to the drain of PMOS transistor 164, which has its source coupled to the first voltage supply. Node 158 is coupled to the gate of transistor 164 and to switch 106.

Figure 4:
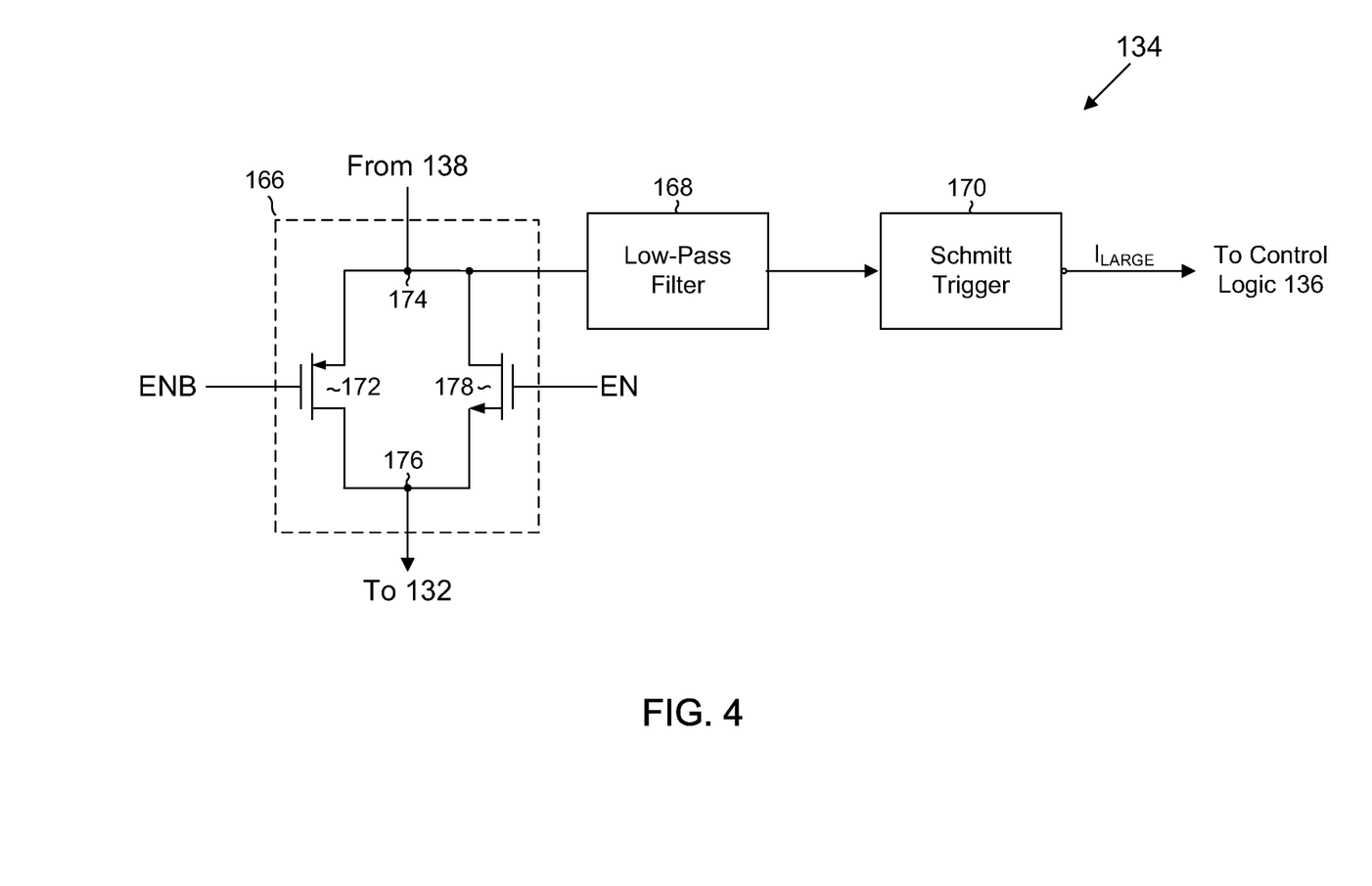
FIG. 4 is a circuit diagram of one example of a current comparison block in accordance with the voltage-to-current converters illustrated in FIGS. 2 and 3.

FIG. 4 illustrates one example of a current compare circuit 134, which includes a transmission gate 166, a low-pass filter 168, and a Schmitt trigger 170. Transmission gate 166 includes a PMOS transistor 172 having a source coupled to node 174, a drain coupled to node 176, and a gate configured to receive a complementary enable signal, ENB. An NMOS transistor 178 has its drain coupled to node 174, its source coupled to node 176, and its gate coupled to the other complementary signal, EN. The complementary enable signals EN and ENB may be controlled by registers from a control circuit (not shown). In some embodiments, the registers of the control circuit that provide the complementary enable signals may be part of PLL 10 as will be understood by one skilled in the art. Node 174 is coupled to current source 138 (FIGS. 2 and 3) and to the input of low-pass filter 168. Node 176 is coupled to the drain of transistor 132 shown in FIGS. 2 and 3.

Low-pass filter 168 receives a current from node 174 and outputs a filtered signal to Schmitt trigger 170. Schmitt trigger 170 latches the signal received from low-pass filter 168 and maintains the output until it receives a different signal from low-pass filter 168. In some embodiments, Schmitt trigger 170 may be implemented as a latch or flip-flop as will be understood by one skilled in the art. Schmitt trigger 170 outputs a current-level signal, $I_{LARGE}$, which identifies if the current flowing from node 174 to 176 is greater than a threshold current, to control logic 136 as shown in FIGS. 2 and 3.

Control logic 136 may be implemented as a state machine that uses the digital input provided by Schmitt trigger 170 to provide a single or multi-bit digital control signals, e.g., $I_{SEL}<3:0>$, to switches 106 and 108 in response to current-level signal $I_{LARGE}$.

Figure 5:
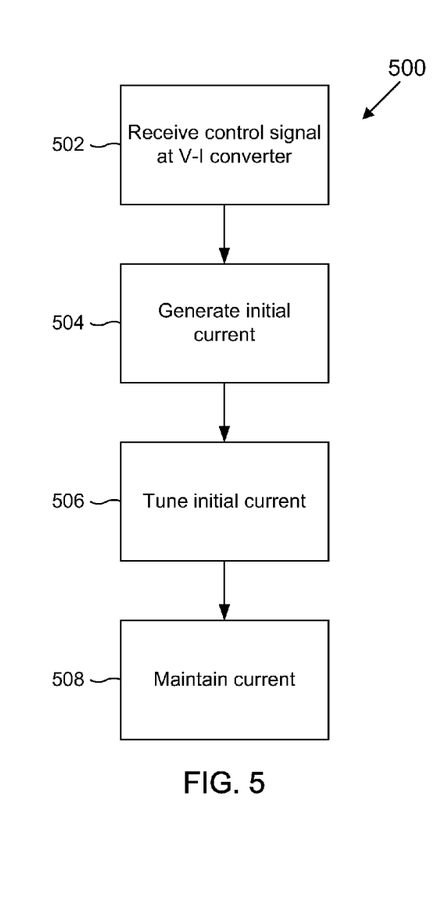
FIG. 5 is a flow diagram illustrating one example of the operation of the voltage-to-current converters illustrated in FIGS. 2 and 3.

The operation of V-I converter circuit 100 is described with reference to FIG. 5, which is a flow diagram of one example of a method 500 of operation of V-I converter 100. At block 502, a control signal, $V_{CTRL}$, is received at the gates of transistors 116 and 140. An initial current, is generated by V-I converter at block 504. The initial current is generated by coupling the gates of transistors 110 and 112 to bias circuitry 102 such that transistors 110 and 112 are turned on. The gates of transistors 110 and 112 are coupled to bias circuitry 102 by closing switches 106 and 108.

As described above, switches 106 and 108 are closed in response to control signals $I_{SEL}<n:0>$ received from control logic 136. For example, switches 106 and 108 may be closed when each bit of $I_{SEL}<n:0>$ is a logic high signal. With transistors 110 and 112 on, current flows through transistors 110 and 112 to node 114. When signal $V_{CTRL}$ is greater than the threshold voltage of transistor 140, $V_{T140}$, then transistor 140 is on and the initial current is provided to ICO 200.

Figure 6:
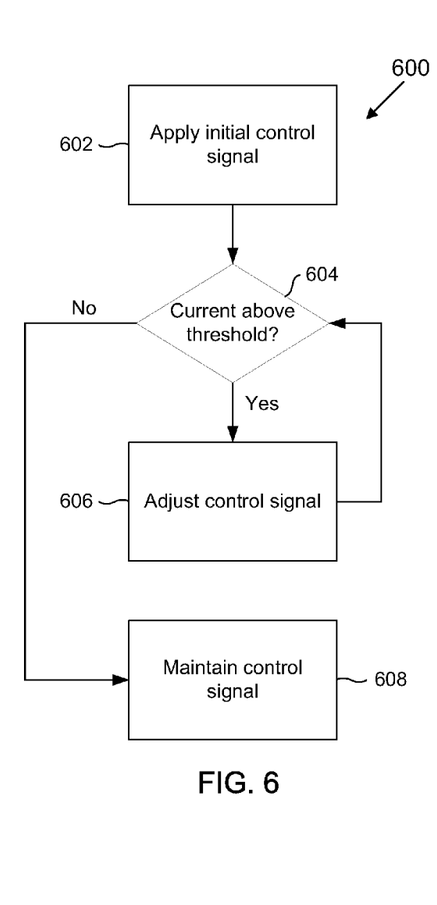
FIG. 6 is a flow diagram illustrating one example of the flow of the control logic.

At block 506, the initial current is tuned to provide the current, $I_{ICO}$, for supplying to ICO 200. The tuning of the initial current may be controlled by current compare block 134 and control logic 136. FIG. 6 illustrates one example of a flow diagram of the tuning method that may be performed by the state machine of control logic 136. As shown at block 602, control logic 136 provides an initial control signal to switches 106 and 108. For example and as best seen in FIG. 2A, control logic 136 may initially output all logic ones, e.g., 1111, to switches 106 and 108 such that the magnitude of $I_{ICO-i}$ is a maximum amount since each of the transistors 110 and 112 is in a current conducting state.

At decision block 604, control logic 134 determines if the current through transistor 132 is at or above a threshold current. The determination of whether the current though transistor 132 is at or above a threshold may be based on the signal, $I_{LARGE}$, received from current compare block 134. For example, the current compare block 134 monitors the current through transistor 132, which is proportional to the current $I_{ICO}$, and outputs the $I_{LARGE}$ signal to control logic 136. If the current through transistor 132 is at or above a threshold, then the $I_{LARGE}$ signal output by current compare block 134 may be a logic one. If the current through transistor 132 is below a threshold, then the $I_{LARGE}$ signal output by current compare block 134 is a logic zero. One skilled in the art will understand that current compare block 134 may output a logic one in other embodiments if the current through transistor 132 is at or below a threshold.

If the current is above the threshold, then control logic proceeds to block 606 where the control signal is adjusted. For example, if the initial control signal was '1111', then control logic 136 may decrement the control signal such that '1110' is output to switches 106 and 108 to decrease current $I_{ICO}$. Referring again to FIG. 2A, outputting '1110' to switches 106 and 108 may close switches 106-3, 106-2, 106-1, 108-3, 108-2, and 108-1 such that bias circuitry 102 continues to be coupled to the gates of transistors 110-3, 110-2, 110-1, 112-3, 112-2, and 112-1 and current continues to pass from VDD to node 114 through these transistors.

The least significant bit of $I_{SEL}$<3:0> being a logic zero may open switches 106-0 and 108-1 such that the gates of transistors 110-0 and 112-0 are not coupled to bias circuitry 102. Transistors 110-0 and 112-0 are in non-current-conducting off states when bias circuitry 102 is not coupled to their gates, which results in a negligible amount (e.g., leakage) of current flowing from VDD to node 114 through transistors 110-0 and 112-0. The method then continues to decision block 604 to determine if the current is still above the threshold as described above.

Once the current through transistor 132 is below the threshold, control logic 136 moves to block 608 where the control signal is maintained. In some embodiments, the control logic 136 may maintains the control signals in a reduced power state to decrease the amount of power consumed by control logic 136. The tuning described above with respect to FIG. 6 enables V-I converter 100 to compensate for process, voltage, and temperature ("PVT") variations while outputting the minimum current to ICO 200.

Referring again to FIG. 5, current $I_{ICO}$ is maintained by V-I converter 100 at block 508. As will be understood by one skilled in the art, V-I converter 100 may provide current $I_{ICO}$ to an ICO, such as ICO 200 shown in FIGS. 2 and 3, or to another circuit.

The improved V-I conversion circuit and method described herein have improved power supply rejection, i.e., reduced noise from a power supply, compared to conventional V-I conversion circuits. Additionally, when the improved V-I conversion circuit is implemented in a VCO of a PLL, the V-I conversion circuit advantageously reduces the amount of phase noise attributable to the VCO.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A conversion circuit, comprising:
   a super source follower circuit configured to lower an impedance of a first node;
   a digital control circuit configured to adjust a current at the first node based on a current through the super source follower; and
   an output transistor having a gate configured to receive a first signal, a drain coupled to a first node, and a source configured to output an output current based on a voltage of the first signal,
   wherein the digital control circuit includes a current compare circuit configured to output a current-level signal based on a comparison of the current through the super source follower circuit to a threshold level, and control logic configured to output a digital output signal, which is based on the current-level signal, to at least one switch to adjust the current at the first node.

2. The conversion circuit of claim 1, further comprising:
   a first plurality of transistors each having a respective source coupled to a first voltage supply and a respective drain coupled to the first node; and
   a first plurality of switches, each of the first plurality of switches respectively coupled to a gate of one of the first plurality of transistors and configured to selectively couple the gate of the respective one of the first plurality of transistors to a bias voltage in response to a digital control signal received from the digital control circuit.

3. The conversion circuit of claim 2, further comprising:
   a second plurality of transistors each having a respective source coupled to the first voltage supply and a respective drain coupled to respective source of one of the first plurality of transistors; and
   a second plurality of switches, each of the first plurality of switches respectively coupled to a gate of one of the second plurality of transistors and configured to selectively couple the gate of the respective one of the second plurality of transistors to the bias voltage in response to a digital control signal received from the digital control circuit.

4. The conversion circuit of claim 1, wherein the current compare circuit includes:
   a low pass filter coupled to a transmission gate and configured to output a filtered signal based on the current through the super source follower; and
   a trigger circuit configured to output the current-level signal based on the filtered signal.

5. The conversion circuit of claim 1, further comprising a second transistor coupled to the super source follower and to the current compare circuit, the second transistor configured to provide the current compare circuit with a mirrored current of the current through the super source follower.

6. The conversion circuit of claim 5, wherein the second transistor has a size that is different from a size of a transistor of the super source follower.

7. The conversion circuit of claim 1, wherein the super source follower includes second and third transistors, the second transistor has a source coupled to the first node and a drain coupled to a gate of the third transistor, the third transistor has a drain coupled to the first node and a source coupled to ground.

8. A method, comprising:
receiving a current at a first node;
receiving a first portion of the current through a super source follower circuit coupled to the first node;
receiving a voltage level at a gate of a transistor coupled to the first node;
outputting a second portion of the first current from the transistor based on the voltage level;
sensing the current through the super source follower; and
outputting a digital control signal to adjust the current at the third node if the current is above a threshold.

9. The method of claim 8, further comprising repeatedly changing the digital control signal to adjust the current at the first node until the current is at or below the threshold.

10. A conversion circuit, comprising:
a first plurality of transistors having respective sources coupled to a first voltage supply and respective drains coupled to a first node;
a first plurality of switches, each of the plurality of switches respectively coupled to a gate of one of the first plurality of transistors;
a super source follower circuit configured to lower an impedance of the first node;
a digital control circuit configured to output digital control signals, which are based on a current through the super source follower, to the first plurality of switches for adjusting a current at the first node by selectively coupling the gates of the first plurality of transistors to a bias voltage; and
an output transistor coupled to the first node and configured to output an output current based on a voltage received at a gate of the output transistor,
wherein the digital control circuit includes a current compare circuit configured to output a current-level signal based on a comparison of the current through the super source follower circuit to a threshold level, and control logic configured to output a digital output signal, which is based on the current level signal, to at least one switch to adjust the current at the first node.

11. The conversion circuit of claim 10, wherein the current compare circuit includes:
a low pass filter coupled to a transmission gate and configured to output a filtered signal based on the current through the super source follower; and
a trigger circuit configured to output the current-level signal based on the filtered signal.

12. The conversion circuit of claim 10, further comprising a sense transistor coupled to the super source follower and to the current compare circuit, the sense transistor configured to provide the current compare circuit with a mirrored current of the current through the super source follower.

13. The conversion circuit of claim 12, wherein the sense transistor has a size that is different from a size of a transistor of the super source follower.

14. The conversion circuit of claim 10, wherein the super source follower includes:
a first transistor having a source coupled to the first node and a drain coupled to ground; and
a second transistor having a source coupled to the first node and a drain coupled to a gate of the first transistor.

15. The conversion circuit of claim 14, wherein the super source follower includes a capacitor coupled to the first node and to the gate of the first transistor.

16. The conversion circuit of claim 14, further comprising a sense transistor having a gate coupled to the gate of the first transistor, a source coupled to ground, and a source coupled to the digital control circuit, the sense transistor configured to provide the digital control circuit with a mirrored current of the current through the super source follower.

17. The conversion circuit of claim 16, wherein the digital control circuit includes:
a current compare circuit configured to output a current-level signal based on a comparison of the mirrored current to a threshold level; and
control logic configured to output a digital output signal, which is based on the current-level signal, to at least one switch to adjust the current at the first node.

18. A conversion circuit, comprising:
a super source follower circuit configured to lower an impedance of a first node;
a digital control circuit configured to adjust a current at the first node based on a current through the super source follower; and
an output transistor having a gate configured to receive a first signal, a drain coupled to a first node, and a source configured to output an output current based on a voltage of the first signal,
wherein the super source follower includes second and third transistors, the second transistor has a source coupled to the first node and a drain coupled to a gate of the third transistor, the third transistor has a drain coupled to the first node and a source coupled to ground.

19. The conversion circuit of claim 18, further comprising:
a first plurality of transistors each having a respective source coupled to a first voltage supply and a respective drain coupled to the first node; and
a first plurality of switches, each of the first plurality of switches respectively coupled to a gate of one of the first plurality of transistors and configured to selectively couple the gate of the respective one of the first plurality of transistors to a bias voltage in response to a digital control signal received from the digital control circuit.

20. The conversion circuit of claim 19, further comprising:
a second plurality of transistors each having a respective source coupled to the first voltage supply and a respective drain coupled to respective source of one of the first plurality of transistors; and
a second plurality of switches, each of the first plurality of switches respectively coupled to a gate of one of the second plurality of transistors and configured to selectively couple the gate of the respective one of the second plurality of transistors to the bias voltage in response to a digital control signal received from the digital control circuit.

21. The conversion circuit of claim 18, wherein the digital control circuit includes:
a current compare circuit configured to output a current-level signal based on a comparison of the current through the super source follower circuit to a threshold level; and
control logic configured to output a digital output signal, which is based on the current-level signal, to at least one switch to adjust the current at the first node.

22. The conversion circuit of claim 21, wherein the current compare circuit includes:
a low pass filter coupled to a transmission gate and configured to output a filtered signal based on the current through the super source follower; and
a trigger circuit configured to output the current-level signal based on the filtered signal.

23. The conversion circuit of claim 21, further comprising a fourth transistor coupled to the super source follower and to the current compare circuit, the fourth transistor configured to provide the current compare circuit with a mirrored current of the current through the super source follower.

24. The conversion circuit of claim 23, wherein the fourth transistor has a size that is different from a size of the third transistor of the super source follower.

25. A conversion circuit, comprising:
- a first plurality of transistors having respective sources coupled to a first voltage supply and respective drains coupled to a first node;
- a first plurality of switches, each of the plurality of switches respectively coupled to a gate of one of the first plurality of transistors;
- a super source follower circuit configured to lower an impedance of the first node;
- a digital control circuit configured to output digital control signals, which are based on a current through the super source follower, to the first plurality of switches for adjusting a current at the first node by selectively coupling the gates of the first plurality of transistors to a bias voltage; and
- an output transistor coupled to the first node and configured to output an output current based on a voltage received at a gate of the output transistor,
- wherein the super source follower includes a first transistor having a source coupled to the first node and a drain coupled to ground, and a second transistor having a source coupled to the first node and a drain coupled to a gate of the first transistor.

26. The conversion circuit of claim 25, wherein the digital control circuit includes a current compare circuit configured to output a current-level signal based on a comparison of the current through the super source follower circuit to a threshold level, and control logic configured to output a digital output signal, which is based on the current-level signal, to at least one switch to adjust the current at the first node.

27. The conversion circuit of claim 26, wherein the current compare circuit includes a low pass filter coupled to a transmission gate and configured to output a filtered signal based on the current through the super source follower, and a trigger circuit configured to output the current-level signal based on the filtered signal.

28. The conversion circuit of claim 26, further comprising a third transistor coupled to the super source follower and to the current compare circuit, the third transistor configured to provide the current compare circuit with a mirrored current of the current through the super source follower.

29. The conversion circuit of claim 28, wherein the third transistor has a size that is different from a size of the first transistor of the super source follower.

30. The conversion circuit of claim 25, wherein the super source follower includes a capacitor coupled to the first node and to the gate of the first transistor.

31. A conversion circuit, comprising:
- a super source follower circuit configured to lower an impedance of a first node, the super source follower circuit including first and second transistors, the first transistor having a source coupled to the first node and a drain coupled to a gate of the second transistor, the second transistor having a drain coupled to the first node and a source coupled to ground; and
- an output transistor having a gate configured to receive a first signal, a drain coupled to a first node, and a source configured to output an output current based on a voltage of the first signal.

32. The conversion circuit of claim 31, further comprising a digital control circuit configured to adjust a current at the first node based on a current through the super source follower,
- wherein the digital control circuit includes a current compare circuit configured to output a current-level signal based on a comparison of the current through the super source follower circuit to a threshold level, and control logic configured to output a digital output signal, which is based on the current-level signal, to at least one switch to adjust the current at the first node.

33. The conversion circuit of claim 32, further comprising:
- a first plurality of transistors each having a respective source coupled to a first voltage supply and a respective drain coupled to the first node; and
- a first plurality of switches, each of the first plurality of switches respectively coupled to a gate of one of the first plurality of transistors and configured to selectively couple the gate of the respective one of the first plurality of transistors to a bias voltage in response to a digital control signal received from the digital control circuit.

34. The conversion circuit of claim 31, further comprising a third transistor having a source coupled to a first voltage supply, a drain coupled to the first node, and a gate coupled to bias circuitry.

* * * * *